US011898808B2

(12) United States Patent
Meyer et al.

(10) Patent No.: US 11,898,808 B2
(45) Date of Patent: Feb. 13, 2024

(54) SUPPORT PLATE THIN CLADDING

(71) Applicant: Apple Inc., Cupertino, CA (US)

(72) Inventors: Robert F. Meyer, Palo Alto, CA (US); William A. Counts, Sunnyvale, CA (US); Michael D. Quinones, Campbell, CA (US); Jason P. Shannon, Sunnyvale, CA (US); David A. Pakula, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 677 days.

(21) Appl. No.: 16/708,159

(22) Filed: Dec. 9, 2019

(65) Prior Publication Data
US 2020/0337184 A1 Oct. 22, 2020

Related U.S. Application Data

(60) Provisional application No. 62/897,668, filed on Sep. 9, 2019, provisional application No. 62/835,931, filed on Apr. 18, 2019.

(51) Int. Cl.
B29D 22/00 (2006.01)
F28F 21/02 (2006.01)
(Continued)

(52) U.S. Cl.
CPC ............ *F28F 21/02* (2013.01); *F28F 21/081* (2013.01); *F28F 21/085* (2013.01);
(Continued)

(58) Field of Classification Search
CPC ........ F28F 21/02; F28F 21/081; F28F 21/085; H05K 7/20436; H05K 7/20472; H05K 7/20481; H05K 7/20509
(Continued)

(56) References Cited

U.S. PATENT DOCUMENTS 5,940,269 A * 8/1999 Ko .................... H01L 23/467
174/16.3
6,288,426 B1 * 9/2001 Gauthier, Jr. ......... H01L 21/763
257/524
(Continued)

FOREIGN PATENT DOCUMENTS

CN 101048055 A 10/2007
CN 203537732 U 4/2014
(Continued)

OTHER PUBLICATIONS

Baker et al., U.S. Appl. No. 16/250,966, filed Jan. 17, 2019.
(Continued)

*Primary Examiner* — Davis D Hwu
(74) *Attorney, Agent, or Firm* — Dorsey & Whitney LLP

(57) ABSTRACT

An electronic device can include a housing and a support component joined to the housing. The support component can include a thermal conduction layer defining a first surface and a second surface opposite the first surface. The support component can also include a first support layer overlying the first surface and a second support layer overlying the second surface. A ratio of the thickness of the thermal conduction layer to the combined thickness of the first support layer and the second support layer can be at least 1.5.

10 Claims, 12 Drawing Sheets

(51) Int. Cl.
*F28F 21/08* (2006.01)
*H05K 7/20* (2006.01)

(52) U.S. Cl.
CPC ..... *H05K 7/20436* (2013.01); *H05K 7/20472* (2013.01); *H05K 7/20481* (2013.01); *H05K 7/20509* (2013.01)

(58) Field of Classification Search
USPC ........................................................ 428/35.8
See application file for complete search history.

(56) References Cited

U.S. PATENT DOCUMENTS

| | | |
|---|---|---|
| 8,872,072 B2 | 10/2014 | Yoshida et al. |
| 10,327,348 B2 | 6/2019 | Wright et al. |
| 2003/0209288 A1 | 11/2003 | Huang |
| 2012/0234524 A1 | 9/2012 | Fan et al. |
| 2017/0094831 A1 | 3/2017 | Khorrami et al. |
| 2017/0359908 A1 | 12/2017 | Fujimura et al. |
| 2018/0045232 A1 | 2/2018 | Capostagno et al. |
| 2019/0037698 A1 | 1/2019 | Shieh et al. |
| 2019/0082555 A1 | 3/2019 | Hooton et al. |
| 2019/0223310 A1 | 7/2019 | Wright et al. |

FOREIGN PATENT DOCUMENTS

| | | | |
|---|---|---|---|
| CN | 103843140 A | | 6/2014 |
| CN | 105517415 A | | 4/2016 |
| CN | 105609476 A | | 5/2016 |
| CN | 106993394 A | | 7/2017 |
| CN | 109074190 A | | 12/2018 |
| CN | 109310011 A | | 2/2019 |
| CN | 208657154 U | | 3/2019 |
| DE | 102005040236 B3 | * | 1/2007 |
| EP | 3193570 A1 | | 7/2017 |
| JP | 2012200141 A | * | 10/2012 |
| KR | 20010085375 A | * | 9/2001 |
| TW | M529869 U | * | 5/2016 |
| TW | M542324 U | * | 5/2017 |
| WO | 2012033896 A1 | | 3/2012 |
| WO | 2013049243 A1 | | 4/2013 |
| WO | 2016051277 A2 | | 4/2016 |
| WO | 2016153644 A1 | | 9/2016 |
| WO | 2018057862 A1 | | 3/2018 |

OTHER PUBLICATIONS

Counts et al., U.S. Appl. No. 16/407,011, filed May 8, 2019.
Feinberg et al., U.S. Appl. No. 16/533,374, filed Aug. 6, 2019.
Spraggs et al., U.S. Appl. No. 62/826,951, filed Mar. 29, 2019.
Wright et al., U.S. Appl. No. 15/839,852, filed Dec. 23, 2016.
"High Conductivity TC1050* Heat Spreader", Marketing Bulletin, Momentive, Strongville, OH, 2014.
Gabzdyl, J. et al., "Joining Dissimilar Materials with Pulsed Nanosecond Fiber Lasers", Laser Technik Journal, Wiley-VCH Verlag GmbH & Co. KGaA, Weinheim, Mar. 2017, (4 pp.).
Jiang, B. et al., "Copper-Graphite-Copper Sandwich: Superior Heat Spreader with Excellent Heat-Dissipation Ability and Good Weldability", Journal of the Royal Society of Chemistry, RSC Adv., 6, Feb. 24, 2016, pp. 25128-25136.

* cited by examiner

SUPPORT PLATE THIN CLADDING

CROSS-REFERENCE TO RELATED APPLICATION(S)

This application claims priority to U.S. Provisional Patent Application No. 62/897,668, filed 9 Sep. 2019, entitled "SUPPORT PLATE THIN CLADDING", and U.S. Provisional Patent Application No. 62/835,931, filed 18 Apr. 2019, entitled "OPTIMIZED WELD STRENGTH FOR DISSIMILAR MATERIALS," the entire disclosures of which are hereby incorporated by reference.

FIELD

The described embodiments relate generally to electronic device components. More particularly, the present embodiments relate to thermal and structural electronic device components.

BACKGROUND

Recent technological advances have enabled manufacturers to include a large number of operational components, such as processors, antennas, displays, cameras, haptic feedback components, and batteries, in a relatively small internal volume defined by a housing or an enclosure of a portable electronic device. Due to the drive for thinner and smaller electronic devices, the internal volume of the device can be relatively small and can include a number of operational components in close proximity with one another. In use, these operational components can generate heat or thermal energy that can cause the components themselves, as well as any other components nearby, to experience elevated operating temperatures. These elevated operating temperatures can reduce device performance and can result in undesirable levels of stress on the components of the device.

Traditionally, electronic devices have included thermal components to manage and redistribute the heat generated by operational components. For example, thermal spreaders and heat sinks can distribute thermal energy to desired areas of the device where the thermal energy can be radiated into the environment or otherwise removed from the device. With the increasingly small and densely packed internal volumes of electronic devices, however, the available space for these thermal management components can be limited. Accordingly, it can be desirable for components of the device that perform other functions, such as structural functions, to also provide thermal management functionalities for an electronic device.

SUMMARY

According to some examples of the present disclosure, an electronic device can include a housing and a support component joined to the housing. The support component can include a thermal conduction layer, and a support structure joined to at least one surface of the thermal conduction layer. A ratio of a thickness of the thermal conduction layer to a thickness of the support structure can be at least 1.5.

In some examples, the thermal conduction layer can define a first surface and a second surface opposite the first surface, and the support structure can include a first support layer overlying the first surface and a second support layer overlying the second surface. The first support layer and the second support layer can have a same thickness. A thickness of the support component can be between 150 microns and 250 microns. The thermal conduction layer can include copper, and the support structure can include steel. The support component can have a Young's modulus of greater than 100 Gigapascals (GPa). The support component can include a substantially planar plate. The support component can have an in-plane thermal conductivity of greater than 250 watts per meter-kelvin (W/(m·K)). The electronic device can further include a nut welded to the support component with a weld strength of greater than 10 kilogram-force (kgf) in tension. The electronic device can further include a nut welded to the support component with a weld strength of greater than 20 kgf in shear.

According to some examples, a support component of an electronic device can include a thermal conduction layer including a first metallic material and graphite. A support layer can be joined to a surface of the thermal conduction layer, the support layer including a second metallic material.

In some examples, the first metallic material can include copper, and the thermal conduction layer can include a graphite sheet encompassed by the first metallic material. The graphite sheet can define at least one through-hole, and the first metallic material can be disposed in the through-hole. The support component can further include an adhesive layer joining the support layer to the surface. The support layer can include steel. The support component can include a substantially planar plate that has an in-plane thermal conductivity of greater than 400 W/(m·K).

According to some examples, a support component of an electronic device can include a non-planar structure including a first portion and second portion extending at an angle from the first portion. The non-planar structure can include a thermal conduction layer defining a first surface and a second surface opposite first surface, a first support layer overlying the first surface, and a second support layer overlying the second surface. A ratio of a thickness of the thermal conduction layer to a combined thickness of the first support layer and the second support layer can be at least 1.5. In some examples, the first support layer and the second support layer can include a metallic material having a less than standard (or relaxed) hardness for stainless steel. The support component can have a thickness and a thermal conductivity in directions perpendicular to the thickness of greater than 200 W/(m·K). The angle can be 90° or less.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
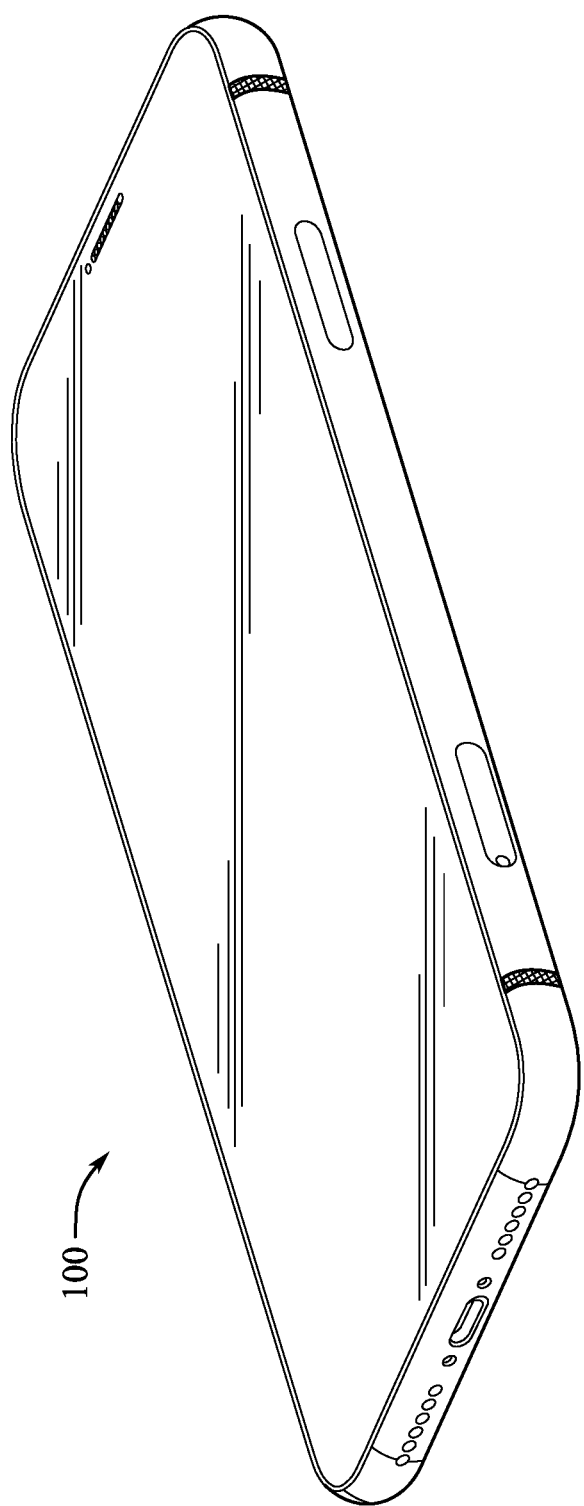
FIG. 1 shows a perspective view of an electronic device.

Reference will now be made in detail to representative examples illustrated in the accompanying drawings. It should be understood that the following descriptions are not intended to limit the examples to one preferred embodiment. To the contrary, it is intended to cover alternatives, modifications, and equivalents as can be included within the spirit and scope of the described examples, as defined by the appended claims.

Although recent technological advances have enabled portable electronic device manufacturers to physically fit a large amount of different operational components, such as processors, memory, sensors, haptic engines, and batteries, within a single enclosure of an electronic device, some or all of these components can generate heat or thermal energy during operation. Accordingly, aside from the physical constraints associated with fitting a desired number of components in a device enclosure, consideration must be given to ensuring that the thermal energy generated by the components does not raise the device's temperature above desired levels, thereby reducing the device's performance or providing an undesirable user experience.

Traditionally, this type of thermal management can be achieved by dedicated thermal components, such as thermal spreaders and heat sinks, that can conduct heat away from operational components to desired locations where the heat can be safely radiated into the environment to maintain the device's temperature below a desired level or threshold. These components, however, can be large and can prove difficult to integrate into a device enclosure that already includes a large amount of densely packed operational components, without requiring an undesirably large enclosure.

Accordingly, it can be desirable for components that may already be present in the device, such as structural or support components of the device, to also perform these thermal management functions. Specifically, it can be desirable for a structural component that can support one or more components in the device and/or provide stiffness and rigidity to the device, to also have desired thermal conduction properties, thereby allowing the support component to serve as a heat sink and/or thermal spreader for the operational components that are thermally coupled to the support component. Thus, in some examples, support structures or support components can include a thermally conductive layer of material that is capable of conducting thermal energy away from these operational components. In addition to this thermally conductive layer, in some examples, a support component can also include a relatively stiff and mechanically rigid support structure, such as in the form of one or more support layers that are joined to the thermally conductive layer. The support structure can also enable the support structure or component to be welded to the enclosure or other components of the device with a desired weld strength, thereby preventing the operational components from becoming misaligned when the device experiences high mechanical stresses or loads, such as during a drop event.

In some examples, an electronic device can include a housing or an enclosure defining an internal volume, and one or more electronic components disposed in the internal volume. The device can also include a support component disposed in the internal volume that is joined to the housing at one or more locations, for example, by welding. The support component can be substantially planar and can include a thermal conduction layer defining a first surface and a second, opposing surface. A first support layer can be directly joined to the first surface, and a second support layer can be directly joined to the second surface. The ratio of the thickness of the thermal conduction layer to the combined thickness of the first support layer and the second support layer can be at least 1.5. The thermal conduction layer can include a relatively highly thermally conductive material, such as a copper alloy, while the support layers can include a relatively stiff or rigid material, such as a steel alloy.

These and other examples are discussed below with reference to FIGS. 1-12C. However, those skilled in the art will readily appreciate that the detailed description given herein with respect to these Figures is for explanatory purposes only, and should not be construed as limiting.

FIG. 1 illustrates a perspective view of an example of an electronic device 100. The electronic device 100 shown in FIG. 1 is a mobile wireless communication device, such as a smartphone. The smartphone of FIG. 1 is merely one representative example of a device that can be used in conjunction with the systems and methods disclosed herein. Electronic device 100 can correspond to any form of a wearable electronic device, a portable media player, a media storage device, a portable digital assistant ("PDA"), a tablet computer, a computer, a mobile communication device, a GPS unit, a remote-control device, or any other electronic device. The electronic device 100 can be referred to as an electronic device, or a consumer device.

Figure 2:
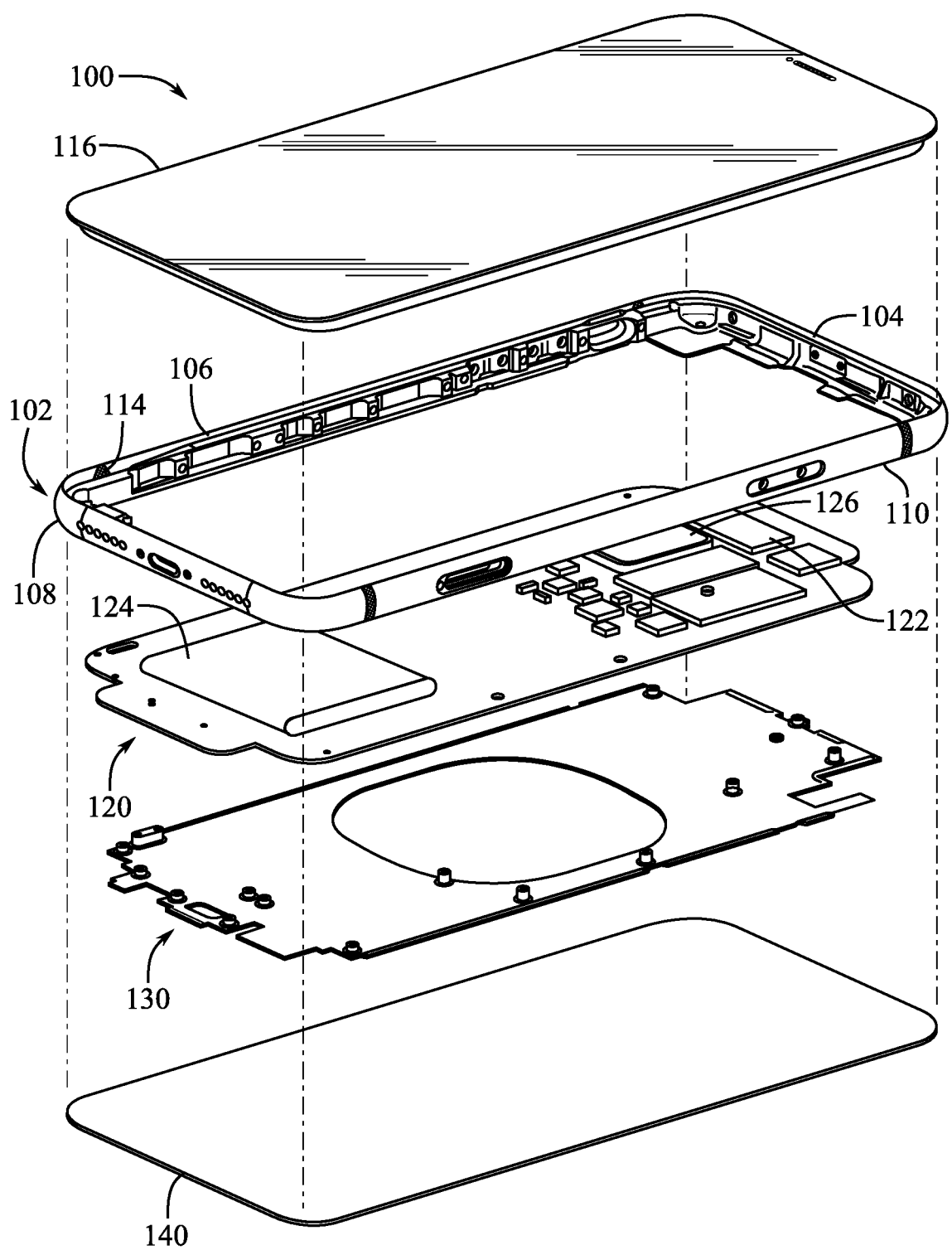
FIG. 2 shows an exploded view of the electronic device of FIG. 1.

FIG. 2 illustrates an exploded view of the electronic device 100. The electronic device 100 can have a housing that includes a frame or a band 102 that defines an outer perimeter and a portion of the exterior surface of the electronic device 100. The band 102, or portions thereof, can be joined to one or more other components of the device, as described herein. In some examples, the band 102 can include several sidewall components, such as a first sidewall component 104, a second sidewall component 106, a third sidewall component 108 (opposite the first sidewall component 104), and a fourth sidewall component 110. The sidewall components can be joined, for example, at multiple locations, to one or more other components of the device, as described herein. The housing of the device 100, for example, the band 102, can include one or more features to receive or couple to other components of the device 100. In some examples, one or more of the sidewall components 104, 106, 108, 110 can include a metallic material, such as steel.

In some examples, some of the sidewall components 104, 106, 108, 110 can form part of an antenna assembly (not shown in FIG. 2). As a result, a non-metal material or materials can separate the sidewall components 104, 106, 108, 110 of the band 102 from each other, in order to electrically isolate the sidewall components 104, 106, 108, 110. For example, a separating material 114 separates the second sidewall component 106 from the third sidewall component 108. The aforementioned materials can include an electrically inert or insulating material(s), such as plastics and/or resin, as non-limiting examples. Further, as described herein, one or more of the sidewall components 104, 106, 108, 110 can be electrically or physically connected to internal components of the electronic device 100, such as a support component 130, as described herein. In some examples, these electrical connections can be achieved by joining a sidewall component 104, 106, 108, 110 to an internal component, for example, as part of the antenna assembly.

The electronic device 100 can further include a display assembly 116 that can include an outer protective layer or cover. The display assembly 116 can include multiple layers, with each layer providing a unique function. In some examples, the outer layer, cover, or portion of the display assembly 116 defining an external surface of the device 100 can be considered part of the housing of the device. Further, the protective cover of the display assembly 116 can include any transparent material, or combination of desired materials, such as polymeric material, and/or ceramic material such as sapphire or glass. In some examples, the display assembly 116 can include a display component, such as a liquid crystal display (LCD) component or a light emitting diode (LED) display component. In some examples, the display assembly 116 can include a touch sensitive layer and/or one or more touch sensors. In some examples, the display assembly 116 can be received by, and/or be attached to, the band 102 by one or more attachment features.

The device 100 can include internal components, such as a system in package (SiP) 126, including one or more integrated circuits such as a processors, sensors, and memory. The device 100 can also include a battery 124 housed in the internal volume of the device 100. Additional components, such as a haptic engine 122, can also be included in the device 100. In some examples, one or more of these internal components can be mounted to a circuit board 120 that can be joined or affixed to other components of the device 100, such as the band 102.

The electronic device 100 can further include a support component 130, also referred to as a support plate, back plate, or chassis, that can perform a number of functions. For example, the support component 130 can provide structural support for the electronic device 100. The support component 130 can include a rigid material, such as a metal or metals, as described herein. In some examples, the support component 130 can aid in the thermal management of the device 100, such as by acting as a thermal spreader or heat sink for one or more components of the device. In some examples, the support component 130 can include a thermal conduction layer of material than can transport thermal energy or heat from a component of the device 100 to one or more other desired locations or other components of the device 100. For example, the SiP 126 can produce a thermal load during operation, and can be thermally coupled to the support component 130. At least some of the thermal load of the SiP can be transferred to the support component 130, whereupon this thermal energy can be distributed throughout the support component 130 and/or to one or more other components connected thereto.

In some examples, the support component 130 can have a composite construction including a thermal conduction layer and two or more layers of support material or structure, also referred to as support layers or cladding layers. The support component 130 can be physically, electrically, and/or thermally coupled to the band 102. In this manner, the support component 130 can, for example, provide an electrical grounding path for components electrically coupled to the support component 130, such as a compass or an antenna. The support component 130 can also include one or more attachment features such that one or more components of the electronic device 100 can be attached to the support component 130, for example, by fasteners and/or by welding, as described herein. In some examples, the support component 130 can be joined to the band 102 of the device 100 at one or more locations by any desired method, such as welding.

Figure 3:
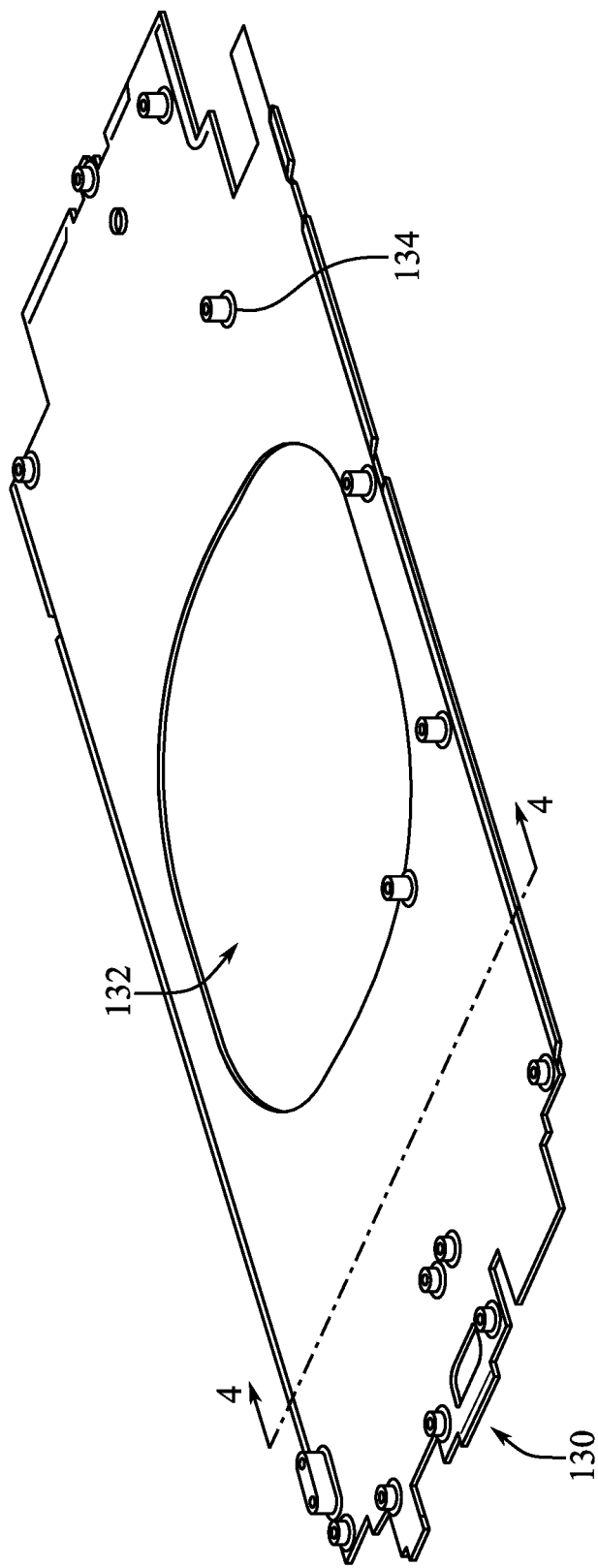
FIG. 3 shows a perspective view of a component of the electronic device of FIG. 1.

An exterior surface of the electronic device 100 can further be defined by a back cover 140 that can be coupled to one or more other components of the device 100. In this regard, the back cover 140 can combine with the band 102 to form an enclosure or housing of the electronic device 100, with the enclosure or housing (including band 102 and back cover 140) at least partially defining an internal volume. The back cover 140 can include a transparent material such as glass, plastic, sapphire, or combinations thereof. An inner portion of the back cover 140 can be bonded, such as with an adhesive, to the support component 130. The portion of the support component 130 that is bonded to the back cover 140 can protrude relative to other peripheral portions thereof, so that welds can be provided within a space that can be between the support component 130 and the back cover 140 when the device 100 is assembled. This clearance can allow the parts to be assembled without interference between welds on the support component 130 and the back cover 140. Additionally or alternatively, the back cover 140 can be bonded directly to the band 102, or coupled to the band 102 by an interference or other mechanical engagement. FIG. 3 illustrates further details of the support component 130 of the device 100.

FIG. 3 shows a perspective view of the support component 130 of the electronic device 100. As can be seen, the support component 130 can have a substantially planar or flat shape or profile. That is, the support component 130 can have a desired shape extending in any number of desired distances and configurations in two dimensions, while having a substantially uniform height or thickness in a third dimension perpendicular to the first two dimensions. Thus, in some examples, the support component 130 can include a plate, sheet, or other substantially planar structure having any desired peripheral profile. The support component 130 can have a substantially planar shape or profile, but can nevertheless include one or more non-planar portions or features, such as protrusions, bumps, flanges, combinations thereof, or any other desired features. Further, in some examples, the support component 130 can define a first surface, also referred to as a top surface (shown), and a second surface opposite the first surface, also referred to as the bottom surface (not shown).

In some examples, the support component 130 can define one or more apertures or through-holes, such as an aperture 132 disposed at any desired location on the support component 130. In some examples, the aperture 132 can allow components or electromagnetic radiation to pass through the support component 130 at the location of the aperture 132. That is, the aperture 132 can allow for communication, signals, power, or other forms of electromagnetic radiation to pass through the support component 130. In some examples, wires, connectors, or any other desired component or components can pass through the aperture 132. In some examples, the aperture 132 can be sized and positioned to correspond to a size and position of a component that can transmit and/or receive electromagnetic radiation, such as an inductive charging component that can be disposed within the device 100. Thus, in some examples, the aperture 132 can allow for inductive coupling of the inductive charging component with a corresponding exterior inductive charging components, without the material of the support component 130 disposed therebetween.

In some examples, the support component 130 can include or define one or more attachment features. For example, all or a portion of the periphery of the support component 130 can be shaped to provide attachment features or locations for one or more other components of the device 100, such as the band 102. In some examples, components can be attached to the support component 130 at any location, such as at a location of an attachment feature, by welding, joining, bonding, adhering, or any other desired form or combination of forms of attachment. As can be seen, in some examples, a nut or other fastener 134 can be joined to the support component 130, such as to a surface thereof. In some examples, the nut or fastener 134 can be welded to the support component 130. In some examples, the nut 134 can be used to secure, or physically or thermally couple one or more components of the device 100 to the support component 130.

As described herein, the structure and materials of the support component 130 can allow the support component 130 to achieve high levels of thermal conductivity, while also providing desired levels of physical support and securement to the device 100 and/or components thereof. For example, a weld strength of a weld joining a component, such as a nut 134 or other fastener, to the support component 130 can be greater than about 8 kilograms-force (kgf) in tension. That is, a force of greater than 8 kgf must be applied to the nut 134 in a direction normal to, and away from, the surface of the support component 130 to cause the weld to fail. In some examples, a weld strength of a weld joining a component, such as a nut 134 or other fastener, to the support component 130, can be greater than about 10 kgf, 12 kgf, 14 kgf, 16 kgf, or even 20 kgf or more in tension.

In some examples, a weld strength of a weld joining a component, such as a nut 134 or other fastener, to the support component 130 can be greater than about 18 kgf in shear. That is, a shear force of greater than 18 kgf must be applied to the nut 134 in a direction parallel to the surface of the support component 130 to cause the weld to fail. In some examples, a weld strength of a weld joining a component, such as a nut 134 or other fastener, to the support component 130 can be greater than about 20 kgf, 22 kgf, 24 kgf, 26 kgf, or even 30 kgf or more in shear. Further details of the structure of the support component 130 are described below with reference to FIG. 4.

Figure 4:
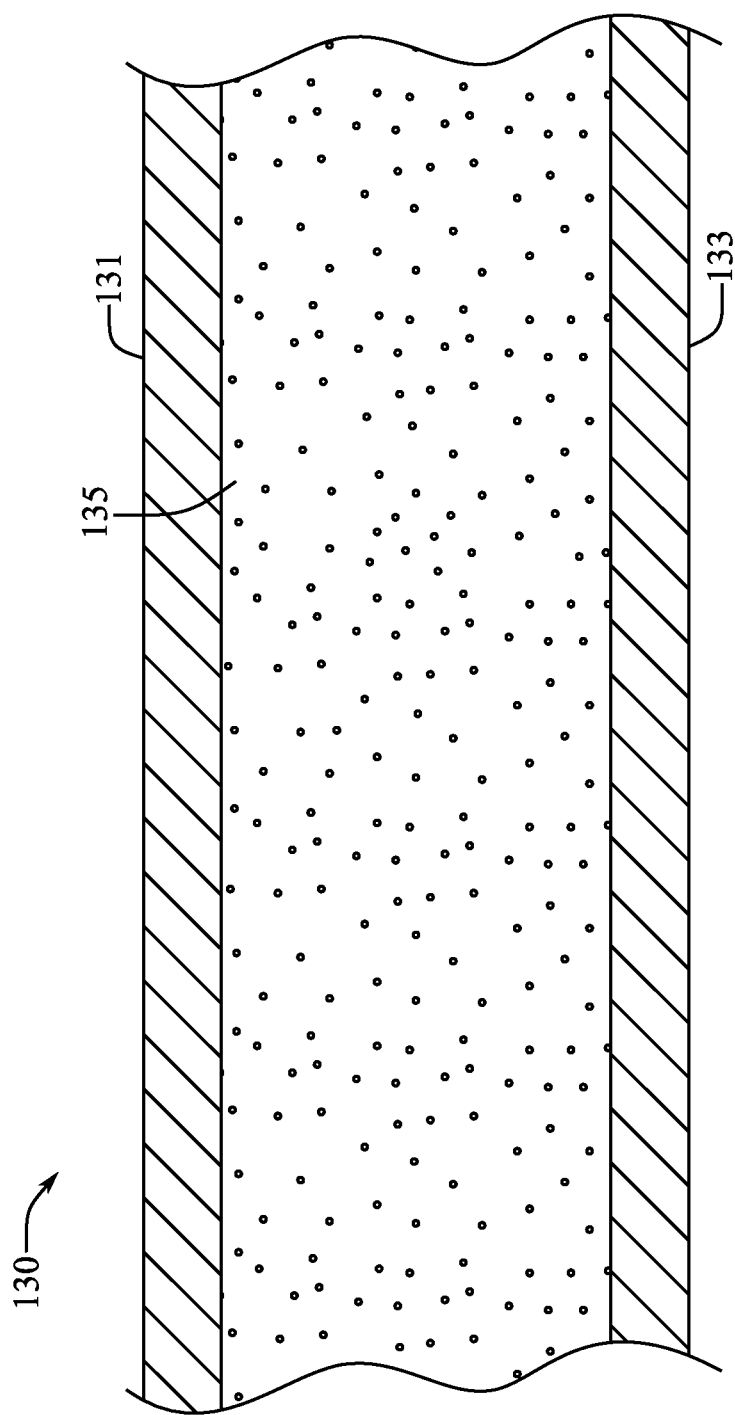
FIG. 4 shows a cross-sectional view of the component of FIG. 3.

FIG. 4 shows a cross-sectional view of a portion of the support component 130. In some examples, the support component 130 can include a composite material including two or more different materials joined together to form the support component 130. In some examples, the support component 130 can include a thermal conduction layer 135 and one or more layers of a support structure joined to, bonded to, or otherwise disposed on or overlying one or more surfaces of the thermal conduction layer 135. In some examples, the support structure can be directly bonded to one or more surfaces of the thermal conduction layer 135. In some examples, the support structure can at least partially surround or encompass the thermal conduction layer 135. For example, the support component 130 can include a first support layer 131 disposed on (e.g., directly on) or overlying a first surface of the thermal conduction layer 135, and a second support layer 133 disposed on (e.g., directly on) or overlying a second, opposing surface of the thermal conduction layer 135.

In some examples, the layers of the support component 130 can have a variety of thicknesses. For example, a thickness of the thermal conduction layer 135 can be greater than a combined thickness of the first support layer 131 and the second support layer 133. In some examples, the first support layer 131 can have a same or similar thickness as the second support layer 133. Although, in some examples, the first support layer 131 can have a different thickness than the second support layer 133. In some examples, a ratio of the thickness of the thermal conduction layer 135 to a total thickness of the support structure, that is, to a combined thickness of the first support layer 131 and the second support layer 133 where the support structure includes separate layers, can be greater than 1. In some examples, the ratio of the thickness of the thermal conduction layer 135 to the total thickness of the support structure 131, 133 can be greater than 1.5, greater than 2, greater than 2.25, greater than 2.5, greater than 2.75, or even greater than 3 or more. In some examples, the ratio of the thickness of the thermal conduction layer 135 to the total thickness of the support structure 131, 133 can be about 2.33.

In some examples, the support component 130 can have a total thickness, that is a combined thickness of the thermal conduction layer 135 and the support structure 131, 133, between about 50 microns and about 1000 microns, between about 100 microns and about 500 microns, or between about 150 microns and about 250 microns. In some examples, the support component can have a thickness of about 200 microns. In some examples, the thermal conduction layer 135 can have a thickness of about 140 microns, the first support layer can have a thickness of about 30 microns, and the second support layer can have a thickness of about 30 microns.

As described herein, the support component 130 can have a substantially planar shape or profile. That is, the support component 130 can have any desired dimensions in two directions, and a substantially uniform thickness or height in a third direction perpendicular to the two directions. The support component can have an in-plane thermal conductivity, that is, a thermal conductivity measured in the two direction normal to the thickness of the support component 130. In the present example, the in-plane thermal conductivity can be considered to be the thermal conductivity measured in the plane extending left and right, as well as into and out of the page, as shown in FIG. 4. In some examples, the support component 130 can have an in-plane thermal conductivity of greater than 200 watts per meter-kelvin (W/(m·K), greater than 225 W/(m·K), greater than 250 W/(m·K), greater than 275 W/(m·K), greater than 280 W/(m·K), greater than 290 W/(m·K), or even greater than 300 W/(m·K) or more. In some examples, the support component 130 can have an in-plane thermal conductivity of between 250 and 290 W/(m·K).

In some examples, the thermal conduction layer 135 can include a material or materials having a relatively high thermal conductivity, such as a thermal conductivity greater than 300 W/(m·K), greater than 350 W/(m·K), greater than 375 W/(m·K), or even greater than 400 W/(m·K) or more. In some examples, the thermal conduction layer 135 can include a metallic material. For example, the thermal conduction layer 135 can include copper or an alloy thereof. In some examples, the thermal conduction layer 135 can include a copper alloy that is substantially free of oxygen, such as a C102 alloy.

In some examples, the support structure, such as the material of support layer 131 and/or support layer 133, can include a relatively stiff or rigid material, such as a material or materials having a Young's modulus of greater than 150 Gigapascals (GPa), greater than 160 GPa, greater than 170 GPa, greater than 180 GPa, greater than 190 GPa, greater than 200 GPa, or greater than 210 GPa, 220 GPa, 230 GPa, or even 250 GPa or more. This support structure can provide mechanical support or stiffness to the support component 130. Thus, in some examples, the support component 130 can have a Young's modulus greater than 100 GPa, greater than 105 GPa, greater than 110 GPa, greater than 115 GPa, or even greater than 120 GPa or more. In some examples, one or both of the support layers 131, 133 can include a metallic material, such as a metallic material different than the material of the thermal conduction layer 135. In some examples, the support structure can include a metallic material such as steel or titanium. In some examples, the support structure can include a stainless steel alloy, such as 316 stainless steel.

Any number or variety of electronic device components can include a structure including a thermal conduction layer and a support structure joined or affixed thereto, as described herein. A support component or any other component of an electronic device can be formed not only from the specific materials and components described herein, but by any number of materials, components, and processes in any combination, as described herein. Various examples of support components and materials and processes for forming the same are described below with reference to FIGS. 5-8.

Figure 5:
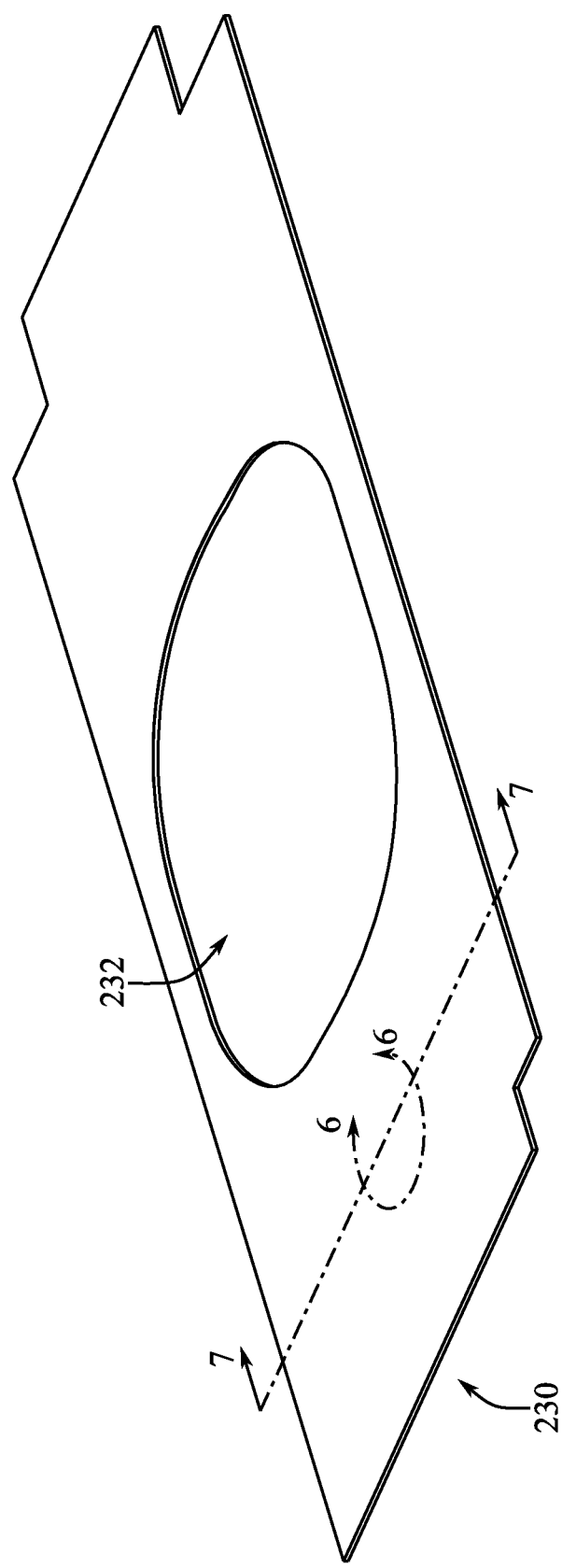
FIG. 5 shows a perspective view of a component of an electronic device.

FIG. 5 illustrates a perspective view of a support component 230 that can be substantially similar to, and can include some or all of the features of the support components described herein, such as support component 130. The support component 230 can have a substantially planar or flat shape or profile. That is, the support component 230 can have a desired shape extending in any amount of desired distances and configurations in two dimensions, while having a substantially uniform height or thickness in a third dimension perpendicular to the first two dimensions. Thus, in some examples, the support component 230 can include a plate, a sheet, or another substantially planar structure having any desired peripheral profile. The support component 230 can have a substantially planar shape or profile, but can nevertheless include one or more non-planar portions or features, such as protrusions, bumps, flanges, combinations thereof, or any other desired features. Further, in some examples, the support component 230 can define a first surface, also referred to as a top surface (shown), and a second surface opposite the first surface, also referred to as the bottom surface (not shown).

In some examples, the support component 230 can define one or more apertures or through-holes, such as an aperture 232 disposed at any desired location on the support component 230. In some examples, the aperture 232 can allow components or electromagnetic radiation to pass through the support component 230 at the location of the aperture 232, as described herein. In some examples, the support component 230 can include or define one or more attachment features or locations. For example, all or a portion of the periphery of the support component 230 can be shaped to provide attachment features or locations for one or more other components of an electronic device, as described herein. In some examples, components can be attached to the support component 230 at any location, such as at a location along the periphery of the support component 230, or to one or more surfaces thereof, by welding, joining, bonding, adhering, or any other desired form or combination of forms of attachment.

As described herein, a weld strength of a weld joining a component to the support component 230, for example, to a top surface thereof, can be greater than about 8 kgf in tension. In some examples, a weld strength of a weld joining a component to the support component 230 can be greater than about 10 kgf, 12 kgf, 14 kgf, 16 kgf, or even 20 kgf or more in tension. In some examples, a weld strength of a weld joining a component to the support component 230, for example, to a top surface thereof, can be greater than about 18 kgf in shear. In some examples, a weld strength of a weld joining a component to the support component 230 can be greater than about 20 kgf, 22 kgf, 24 kgf, 26 kgf, or even 30 kgf or more in shear. Further details of the structure of the support component 230 are described below with reference to FIG. 6.

Figure 6:
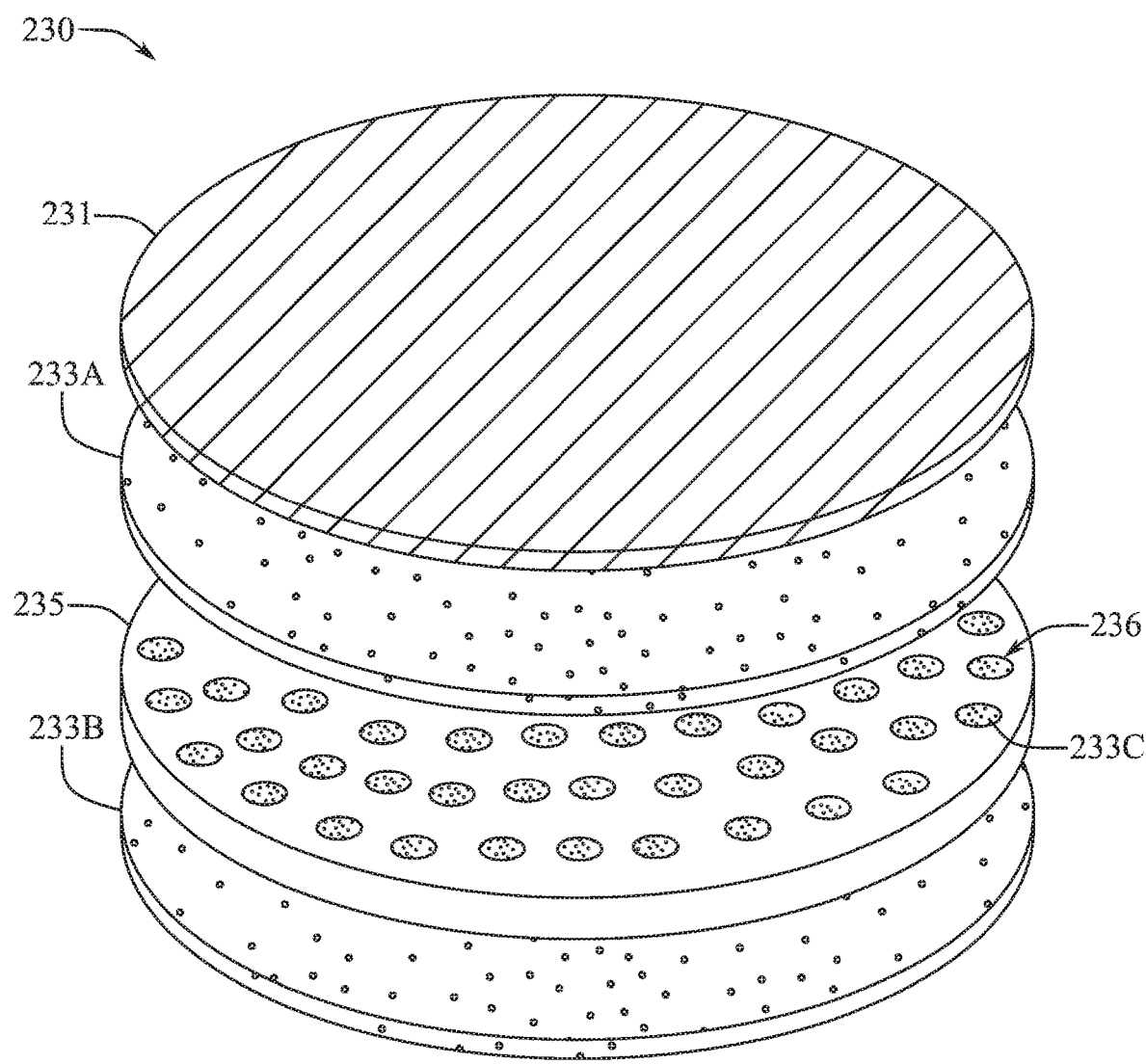
FIG. 6 shows an exploded view of a portion of the component of FIG. 5.

FIG. 6 shows an exploded view of a portion of the support component 230. As can be seen, the support component 230 can include a number of layers that are bonded, welded, adhered, or otherwise joined together by any desired technique or combination of techniques. In some examples, the support component 230 can include a thermal conduction layer or layers, here including layers or portions 233A, 233B, 233C, 235, and a support structure or support layer 231 joined to, bonded to, or otherwise disposed on or overlying one or more surfaces of the thermal conduction layer or layers. In some examples, the support layer 231 can be joined to, bonded to, or otherwise disposed on or overlying a surface of the layer 233A. In some examples, the support layer 231 can be joined to, bonded to, or otherwise disposed on or overlying a surface of the layer 233B. In some examples, the support component 230 can include multiple support layers 231, and a first support layer 231 can be joined to, bonded to, or otherwise disposed on or overlying a surface of the layer 233A, while a second support layer 231 can be joined to, bonded to, or otherwise disposed on or overlying a surface of the layer 233B, opposite the joined surface of the layer 233A.

In some examples, the thermal conduction layer or portion of the support component 230 can include a first thermally conductive material 233A, 233B, 233C at least partially encompassing or surrounding a second, different thermally conductive material 235. In some examples, the second thermally conductive material 235 can define one or more apertures or through-holes 236 that can span an entire thickness of the second thermally conductive material 235 at the location of the through-hole 236. Thus, in some examples, a through-hole 236 of the second thermally conductive material 235 can be defined by a through-hole surface that joins, connects to, or is in communication with a first or top surface, and an opposing second or bottom surface of the second thermally conductive material 235. In some examples, the through-hole or through-holes 236 can have any desired shape or variety of shapes, and can further have any desired size or variety of sizes. A through-hole 236 can be formed by any desired technique. For example, a through-hole 236 can be formed by a laser cutting or drilling process, a machining process, or any other subtractive manufacturing process. In some examples, the layer of second thermally conductive material 235 can be formed into a shape defining the through-hole 236, such as by a molding or a casting process, or any other desired additive manufacturing process. In some examples, the second thermally conductive material 235 can be formed by any desired combination of additive and subtractive manufacturing processes.

In some examples, a first layer 233A of the first thermally conductive material can be joined to, bonded to, or otherwise disposed on or overlying one or more surfaces of the second thermally conductive material 235. In some examples, a second layer 233B of the first thermally conductive material can be joined to, bonded to, or otherwise disposed on or overlying one or more surfaces of the second thermally conductive material 235, such as a surface opposite the surface on which the first layer 233A is disposed. Additionally, in some examples, at least some of the first thermally conductive material 233C can be disposed in the one or more through-holes 236 defined by the second thermally conductive material 235. In some examples, the portion or portions 233C of the first thermally conductive material can occupy substantially the entire volume of the through-hole or through-holes 236. In some examples, a portion 233C can join or connect the first layer 233A and the second layer 233B of the first thermally conductive material, to thereby provide a mechanical or physical support to maintain the layers 233A, 233B in their desired locations and orientations with respect to the second thermally conductive material 235.

In some examples, the portions and layers 233A, 233B, 233C of the first thermally conductive material can be integrally formed and can be a substantially unitary or single piece of material. For example, the portions and layers 233A, 233B, 233C of the first thermally conductive material can be formed around the second thermally conductive material 235. In some examples, the first thermally conductive material can be provided in a flowable, moldable, molten, or gaseous state to flow or be forced through the through-holes 236, and to cover the surfaces of the second thermally conductive material 235. In some examples, however, the first thermally conductive material 233C can be provided in the through-holes 236, and the first layer 233A and/or second layer 233B can be separately formed and adhered, bonded to, or otherwise joined to the portions 233C. Further details of the structure of the support component 230 are described below with reference to FIG. 7.

Figure 7:
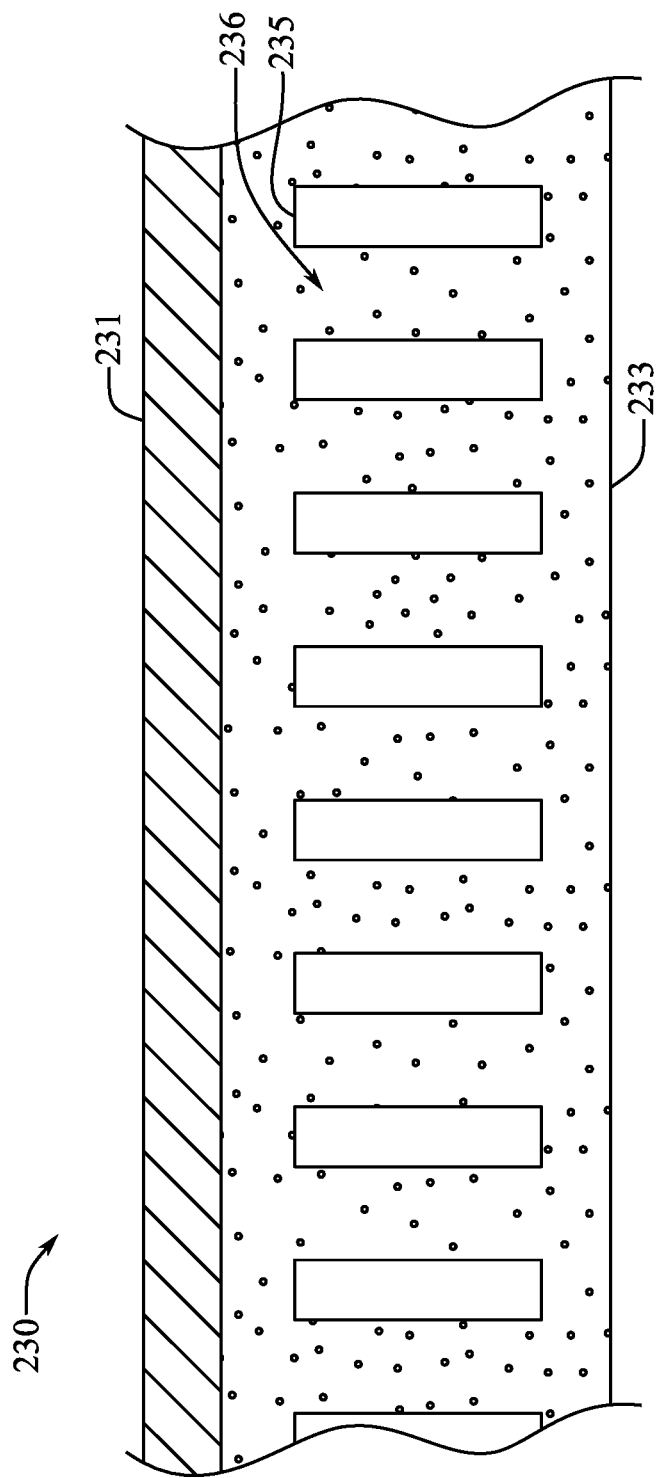
FIG. 7 shows a cross-sectional view of the component of FIG. 5.

FIG. 7 shows a cross-sectional view of a portion of the support component 230 including a support layer 231 joined to a surface of the first thermally conductive material 233, and a second thermally conductive material 235 defining apertures or through-holes 236 encompassed by the first thermally conductive material 233.

In some examples, the support component 230 can have a total thickness, that is a combined thickness of the support layer 231 and the first thermally conductive material 233 and second thermally conductive material 235, of between about 50 microns and about 1000 microns, between about 100 microns and about 500 microns, or between about 150 microns and about 250 microns. In some examples, the support component 230 can have a thickness of about 200 microns.

In some examples, the layers of the support component 230 can have a variety of thicknesses. For example, a thickness of the second thermally conductive material 235 can be greater than a combined thickness of the layers 233A, 233B of the first thermally conductive material. In some examples, the layer 233A of the first thermally conductive material can have a same or similar thickness as the layer 233B of the first thermally conductive material. Although, in some examples, the layer 233A can have a different thickness than the layer 233B.

In some examples, the total thickness of the thermal conduction layer, including the first thermally conductive material 233 and the second thermally conductive material 235, can be between about 50 microns and about 300 microns, for example, about 150 microns or about 160 microns. In some examples, the second thermally conductive material 235 can have a thickness of between about 50 microns and about 200 microns, such as a thickness of about 100 microns. In some examples, the thickness of the first thermally conductive material 233 disposed on the top and bottom surfaces of the second thermally conductive material 235 can be between about 10 microns and about 200 microns, such as about 50 microns or about 60 microns.

As described herein, the support component 230 can have a substantially planar shape or profile. In some examples, the support component 230 can have an in-plane thermal conductivity of greater than 400 W/(m·K), greater than 425 W/(m·K), greater than 450 W/(m·K), greater than 500 W/(m·K), greater than 550 W/(m·K), greater than 600 W/(m·K), or even greater than 650 W/(m·K) or more.

In some examples, the first thermally conductive material 233 can include any type of material, including metals, ceramics, polymers, and combinations thereof. In some examples, the first thermally conductive material 233 can include a material or materials having a relatively high thermal conductivity, such as a thermal conductivity greater than 300 W/(m·K), greater than 350 W/(m·K), greater than 375 W/(m·K), or even greater than 400 W/(m·K) or more. In some examples, the first thermally conductive material 233 can include a metallic material. For example, the first thermally conductive material 233 can include copper or an alloy thereof. In some examples, the first thermally conductive material 233 can include a copper alloy that is substantially free of oxygen, such as a C102 alloy.

In some examples, the second thermally conductive material 235 can include any type of material, including metals, ceramics, polymers, and combinations thereof. In some examples, the second thermally conductive material 235 can have a higher thermal conductivity than the first thermally conductive material 233. In some examples, the second thermally conductive material 235 can include a material or materials having a relatively high thermal conductivity, such as a thermal conductivity greater than 500 W/(m·K), greater than 750 W/(m·K), greater than 1000 W/(m·K), or even greater than 1500 W/(m·K) or more. In some examples, the second thermally conductive material 235 can include a ceramic material, such as graphite or graphene.

In some examples, the support layer 231 can include a relatively stiff or rigid material, such as a material or materials having a Young's modulus of greater than 150 GPa, greater than 160 GPa, greater than 170 GPa, greater than 180 GPa, greater than 190 GPa, greater than 200 GPa, or greater than 210 GPa, 220 GPa, 230 GPa, or even 250 GPa or greater. In some examples, the support layer 231 can include a metallic material, such as a metallic material different than the material of the first thermally conductive material 233. In some examples, the support layer 231 can include a metallic material such as steel or titanium. In some examples, the support layer 231 can include a stainless steel alloy, such as 316 stainless steel. In some examples, the support layer 231 can have a thickness of between about 10 microns and about 100 microns, for example, a thickness of about 40 microns. Further details of another example of a support component 330 are described below with reference to FIG. 8.

Figure 8:
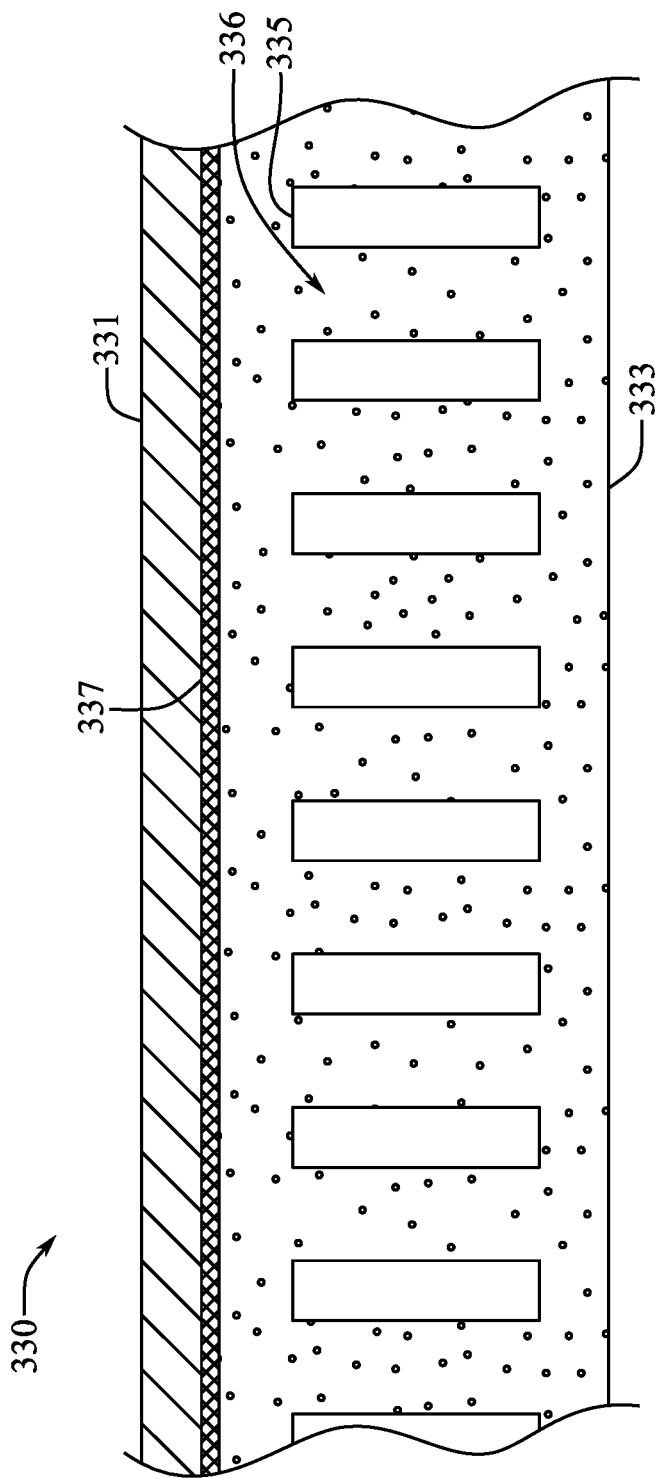
FIG. 8 shows a cross-sectional view of a component of an electronic device.

FIG. 8 shows a cross-sectional view of a support component 330 of an electronic device. The support component 330 can be substantially similar to, and can include some or all of the features of the support components described herein, such as support components 130, 230.

In some examples, the support component 330 can include a thermally conductive layer including a first thermally conductive material 333 at least partially encompassing or surrounding a second thermally conductive material 335. In some examples, the second thermally conductive material 335 can define one or more apertures or through-holes 336 in which the first thermally conductive material 333 can be disposed, such as to mechanically or physically join the portions of the first thermally conductive material 333 disposed on the surfaces of the second thermally conductive material 335. In some examples, the first thermally conductive material 333 and the second thermally conductive material 335 can include any of the materials described with respect to the first and second thermally conductive materials 233, 235, such as copper and graphite, respectively.

The support component 330 can further include a support layer 331. The support layer 331 can be substantially similar to, and can include some or all of the features of the support layer 231 described herein. In some examples, the support layer 331 can include stainless steel. In this example, the support layer 331 can be bonded or adhered to a surface of the first conductive material 333 by a bonding layer 337. In some examples, the bonding layer 337 can include any form of adhesive, glue, or any material capable of forming a strong and durable bond between the support layer 331 and the first thermally conductive material 333. In some examples, the bonding layer 337 can include an adhesive, such as a curable adhesive material, an epoxy or resin, a pressure sensitive adhesive, a heat activated film, or any other desired form or combination of adhesives. In some examples, the bonding layer can have any desired thickness. In some examples, the bonding layer 337 can be thinner than any one of the support layer 331, the first conductive material 333, and the second conductive material 335. In some examples, the bonding layer 337 can have a thickness of less than about 20 microns, less than about 15 microns, less than about 10 microns, or even less than about 5 microns or smaller. In some examples, the bonding layer 337 can have a thickness of about 10 microns.

Any number or variety of electronic device components can include a structure as described herein, including a thermal conduction layer and a support structure joined or affixed thereto. A support component or any other component of an electronic device, as described herein, can be formed not only from the specific materials and components described herein, but by any number of materials, components, and processes in any combination. Various examples of support components and materials, and processes for forming the same, are described below with reference to FIGS. 9-11.

Figure 9:
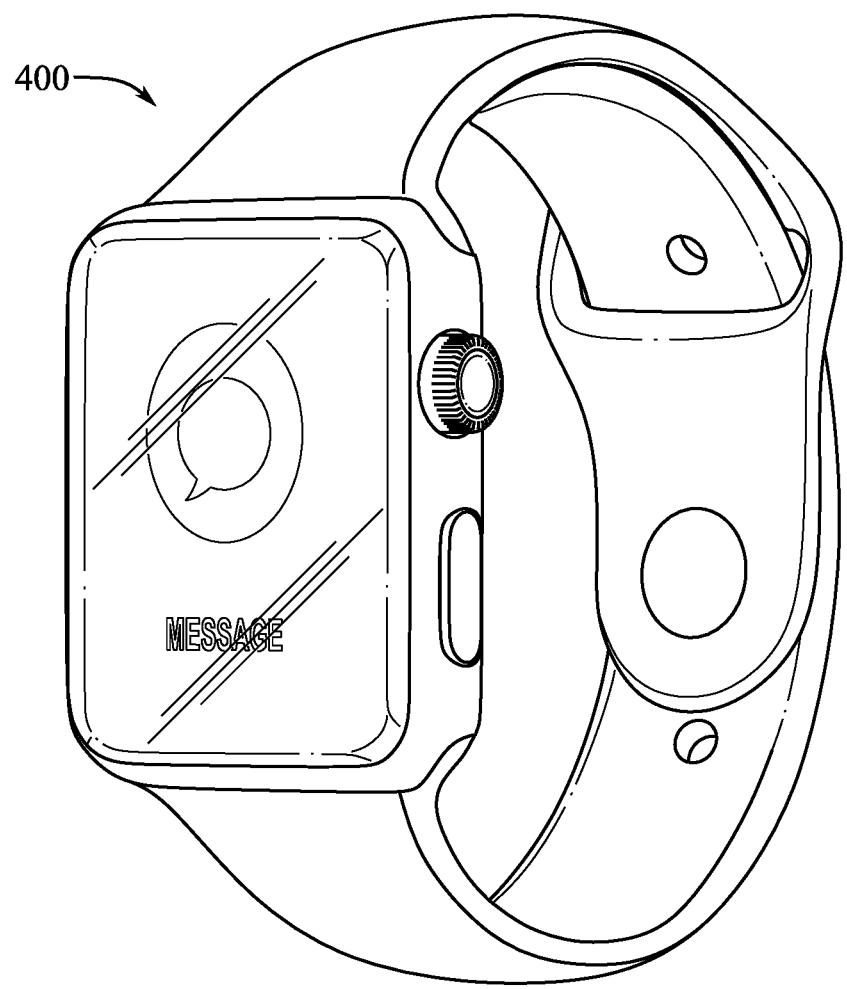
FIG. 9 shows a perspective view of an electronic device.

FIG. 9 shows an example of an electronic device 400. The electronic device shown in FIG. 9 is a watch, such as a smartwatch. The smartwatch 400 of FIG. 9 is merely one representative example of a device that can be used in conjunction with the components and methods disclosed herein. The electronic device 400 can correspond to any form of wearable electronic device, portable media player, media storage device, portable digital assistant ("PDA"), tablet computer, computer, mobile communication device, GPS unit, remote control device, or other device. The electronic device 400 can be referred to as an electronic device, or a consumer device. Further details of the watch 400 are provided below with reference to FIG. 10.

Figure 10:
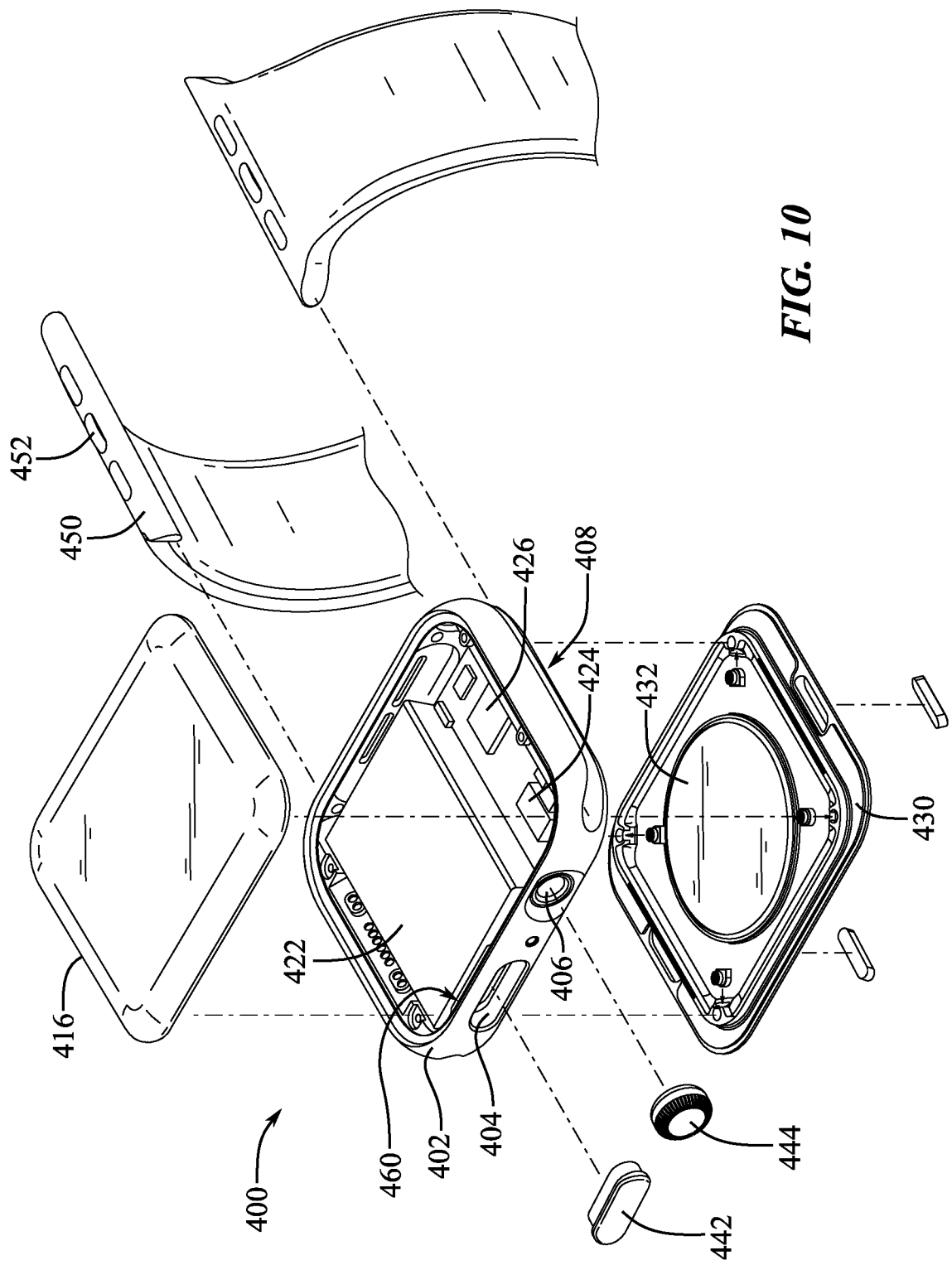
FIG. 10 shows an exploded view of the electronic device of FIG. 9.

Referring now to FIG. 10, the electronic device 400 can include a housing 402, and a cover 416 attached to the housing. The housing 402 can substantially define at least a portion of an exterior surface of the device 400. The cover 416 can include glass, plastic, or any other substantially transparent material, component, or assembly. The cover 416 can cover or otherwise overlay a display, a camera, a touch sensitive surface, such as a touchscreen, or other component of the device 400. The cover 416 can define a front exterior surface of the device 400. A back cover 430 can also be attached to the housing 402, for example, opposite the cover 416. The back cover 430 can include ceramic, plastic, metal, or combinations thereof. In some examples, the back cover 430 can include an electromagnetically transparent portion 432. The electromagnetically transparent portion 432 can be transparent to any wavelength of electromagnetic radiation, such as visual light, infrared light, radio waves, or combinations thereof. The device, such as at the back cover 430, can also include any number or type of sealing components that can serve to prevent the ingress of water or liquid into portions of the internal volume. Together, the housing 402, the cover 416, and the back cover 430 can substantially define an interior volume and an exterior surface of the device 400.

The housing 402 can be a substantially continuous or unitary component, and can include one or more openings 404, 406 to receive components of the electronic device 400 and/or provide access to an internal portion of the electronic device 400. In some examples, the device 400 can include input components such as one or more buttons 442 and/or a crown 444. In some examples, the housing 402 can include or define an attachment feature 408 that can aid in removably attaching a one or more components to the housing 402 of the device. In some examples, the attachment feature 408 can include a recess or a cavity defined by the housing 402, and can further include magnetic material and/or mechanical retention features that engage with a removable attachable component.

In some examples, the device 400 can further include a securement component 450. The securement component 450 can serve to secure or affix the wearable device 400 to a desired object, such as the body of a user. In some examples, this securement component 450 can include a band or a strap that can assist in securing the device 400 by wrapping around a user's arm or wrist to secure the device 400 thereto. The strap 450 can include an attachment feature 452 that can correspond to an engagement or attachment feature 408 defined by the housing 402 of the device 400. For example, the attachment feature 452 can include one or more magnetic components that can magnetically engage or be attracted to magnetic material located near the attachment feature 408 of the housing 402.

The device 400 can also include internal components, such as a battery 422, a haptic engine 424, and a system in package (SiP) 426, including one or more integrated circuits, such as processors, sensors, and memory. The SiP can also include a package. The internal components, such as one or more of components 422, 424, 426 can be disposed within an internal volume defined at least partially by the housing 402, and can be affixed to the housing 402 via internal surfaces, attachment features, threaded connectors, studs, posts, or other features, that are formed into, defined by, or otherwise part of the housing 402 and/or the cover 416 or back cover 430. Further, in some examples, one or more internal components of the device can be held in a desired location and fixed to the device, such as the housing 402, by a support component, as described herein. For example, the electronic device 400 can include a support component 460 that can have one or more electronic components affixed thereto. The support component 460 can be attached to the device 400 at one or more locations, such as at the housing 402. Further details of the support component 460 are described below with reference to FIG. 11.

Figure 11:
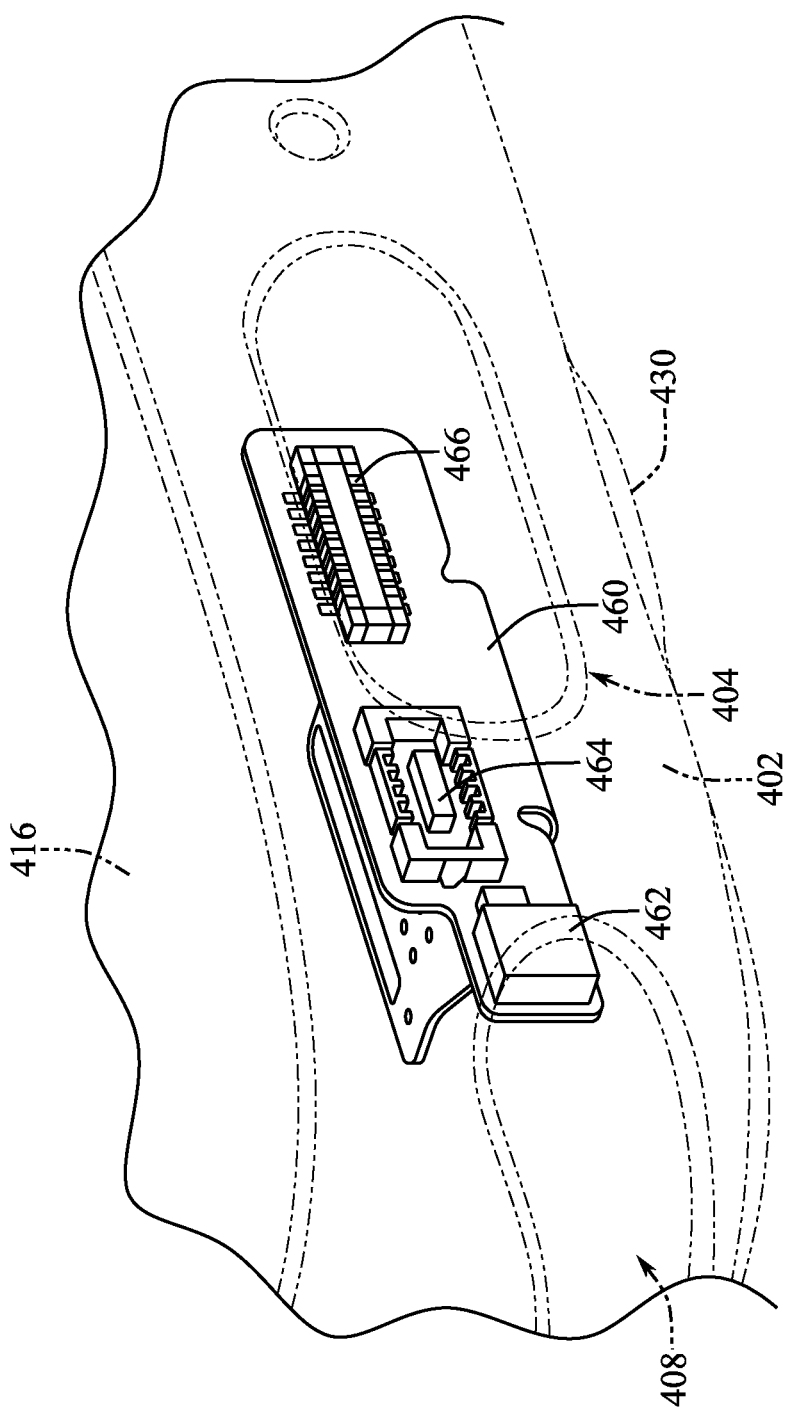
FIG. 11 shows a perspective view of a component of the electronic device of FIG. 9.

FIG. 11 illustrates a view of the support component 460 and its position in the internal volume at least partially defined by the housing 402. In some examples, the support component 460 can take the form of a bracket or a brace. The support component 460 can be affixed to other components of the device 400 by features such as studs, posts, screws, or any other feature for attachment or securement. In some examples, one or more electronic components or sensors can also be affixed to the support component 460. For example, the components 462, 464, and 466 can all be affixed to a surface of the support component 460, as shown, by any desired technique or feature. In some examples, these electronic components 462, 464, 466 can include processors, memory components, sensors, antennas, sound or light emitting components, batteries, or any other desired electronic components. As described herein, the construction and materials of the support component 460 can allow the support component 460 to provide mechanical support to the components 462, 464, 466, while also managing and distributing the thermal loads generated by the components 462, 464, 466, for example, by distributing or directing heat generated by the components 462, 464, 466 to a desired location or locations, so as to allow for improved levels of device performance.

Any number or variety of electronic device components can include a structure, as described herein, including a thermal conduction layer and a support structure joined or affixed thereto. A support component or any other component of an electronic device, as described herein, can be formed not only from the specific materials and components described herein, but by any number of materials, components, and processes, in any combination. Various examples of support components and materials and processes for forming the same are described below with reference to FIGS. 12A-12C.

Figures 12A, 12B:
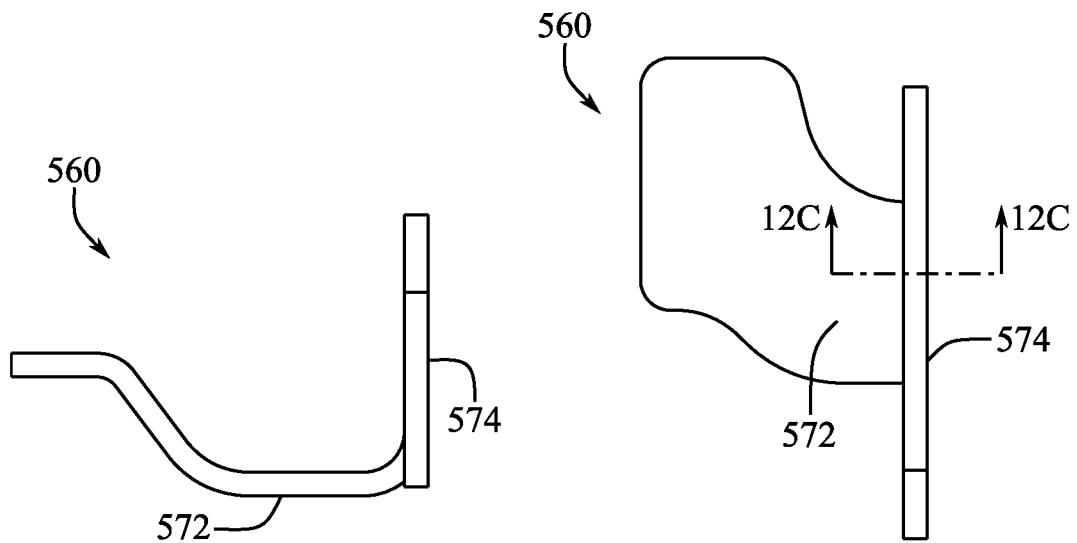
FIG. 12A shows a side view of a component of an electronic device.
FIG. 12B shows a top view of the component of FIG. 12A.

FIG. 12A shows a side view of a support component 560 of an electronic device. The support component 560 can be substantially similar to, and can include some or all of the features of the support components described herein, such as support components 130, 230, 330, 460. As can be seen, in some examples, the support component 560 can have a substantially non-planar or three-dimensional shape, geometry, or profile. For example, the support component 560 can include a first portion 572, and at least a second portion 574, extending from the first portion 572 at an angle. As used herein, the term 'at an angle' refers to a spatial relationship between components or portions of components, where the positional angle of one portion or component relative to a second portion or component is not 180°. In some examples, the second portion 574 can extend from the first portion 572 at any desired angle, such as at an angle of about 90°, as shown. In some examples, the second portion 574 can extend from the first portion 572 at an angle less than or greater than 90°.

FIG. 12B shows a top view of the support component 560 including the first portion 572, which can be a substantially planar or non-planar portion, and the second portion 574 extending at an angle of about 90° therefrom. As can be seen, the first portion 572 and the second portion 574 can have substantially any desired shape, including substantially any desired peripheral shape or profile. Further, in some examples, the first portion 572 can have a thickness that is substantially similar to, or the same as, the thickness of the second portion 574, here measured in a direction perpendicular to the thickness of the first portion 572.

In some examples, the support component 560 can be an integrally formed or substantially unitary component. That is, the component 560 can be formed as a single body, without the need to join, for example, the first portion 572 to the second portion 574. Although, in some examples, this single body can itself include multiple layers or materials. In some examples, the support component 560 can be formed by a drawing process, forming process, forging process, machining process, stamping process, any other additive or subtractive manufacturing process, or combinations thereof.

In some examples, the support component 560 can be formed from a single or unitary sheet, plate, or other substantially planar or flat portion or blank. In some example, the support component 560 can be formed by drawing or bending a substantially planar blank or sheet having a desired peripheral shape into the shape of the support component 560, as shown. For example, a substantially planar sheet or blank having a peripheral shape corresponding to the peripheral shapes of the first portion 572 and the second portion 574 can be bent or drawn so that the second portion 574 is angled relative to the first portion 572, as shown. Accordingly, the support component 560 can include multiple planar or curved portions, such as portions 572, 574, that are integrally formed from a single planar portion or blank.

Figure 12C:
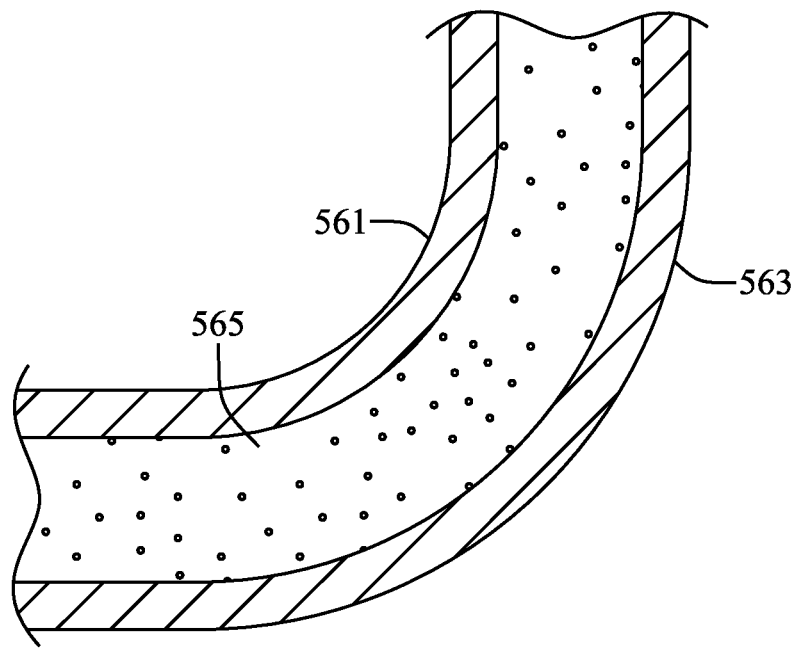
FIG. 12C shows a cross-sectional view of the component of FIG. 12A.

FIG. 12C illustrates a cross-section of the support component 560 taken at the location where the first portion 572 transitions to the second portion 574, that is angled relative to the first portion. As can be seen, the support component 560 can include a thermal conduction layer 565, and one or more support layers 561, 563 that are joined, bonded to, disposed on, or overlying the surfaces of the thermal conduction layer 565. The thermal conduction layer 565 can be substantially similar to, and can include some or all of the features of the thermal conduction layers described herein, such as the layers or materials 135, 233, 235, 333, and/or 335. Accordingly, the support component 560 can have a cross-sectional structure that can be substantially similar to the cross-sectional structures, including any or all of the materials, dimensions, and/or mechanical and thermal properties of the support components 130, 230, 330, as described herein. In some examples, the thermal conduction layer 565 can include a metallic material, such as a copper alloy. In some examples, one or both of the support layers 561, 563 can include a second, different metallic material, such as steel.

In some examples, one or both of the support layers 561, 563 can include a material that can be relatively ductile, while still providing a desired level of mechanical strength, for example, to allow the support layers 561, 563 to be curved or bent into a desired non-planar shape without the formation of cracks, or without delaminating from the thermal conduction layer 565. Thus, in some examples, one or both of the support layers 561, 563 can include a material having a Vicker's Hardness test value of less than 155 HV, less than 140 HV, 129 HV30, or less. For example, one or both of the support layers 561, 563 can include a steel alloy having a hardness of less than 129 HV.

Additionally, as can be seen, the layers 561, 563, 565 can have the same thicknesses in the first portion 572 as in the second portion 574, and this thickness can be substantially maintained in the location of the transition between the portions 572, 574. Accordingly, the support layers 561, 563 can be joined or bonded to, and can overlie the surfaces of the thermal conduction layer 565 even at curved sections of the support component 560, or any other portion where the component 560 has been drawn, formed, or bent into a non-planar orientation. Accordingly, the support layers 561, 563 can at least partially encompass or surround the thermal conduction layer 565 and can prevent exposure of the thermal conduction layer 565 to the ambient environment, even at these curved or bent locations, thereby protecting the material of the thermal conduction layer 565 from being exposed to a potentially corrosive or damaging atmosphere.

Any of the structure, properties, features, or aspects of the components described herein can be combined or included in any varied combination. For example, the design and shape of any component including a thermal conduction layer and a support layer, as described herein is not limited in any way and can be all or a part of any component or components of an electronic device. While certain exemplary materials for the thermal conduction layers and support layers have been discussed, these layers can include any desired material including the described material properties.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

As used herein, the terms exterior, outer, interior, inner, top, and bottom are used for reference purposes only. An exterior or outer portion of a component can form a portion of an exterior surface of the component but may not necessarily form the entire exterior of outer surface thereof. Similarly, the interior or inner portion of a component can form or define an interior or inner portion of the component but can also form or define a portion of an exterior or outer surface of the component. A top portion of a component can be located above a bottom portion in some orientations of the component, but can also be located in line with, below, or in other spatial relationships with the bottom portion depending on the orientation of the component.

As used herein, the terms first and second, such when used to describe a first layer and a second layer, are used for reference only, and are not intended to indicate or imply any order or relation between the layers, material, or components, or any process including the layers, materials, or components. For example, a second layer can be provided, formed, or treated first in a process involving first and second layers. Further, in some examples, the second material can overlie the first material, while in other examples, the first material can overlie the second material. Accordingly, the terms first and second are not intended to limit the order or orientation of materials, layers, or components in any way.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
   a housing; and
   a support component joined to the housing, the support component comprising:
      a thermal conduction layer, the thermal conduction layer comprising a first layer of a first thermally conductive material disposed on a first surface of a second thermally conductive material and a second layer of the first thermally conductive material disposed on a second surface of the second thermally conductive material opposite the first layer of the first thermally conductive material, the second thermally conductive material disposed between the first layer and the second layer of the first thermally conductive material, wherein the first layer of the first thermally conductive material and the second layer of the first thermally conductive material are physically coupled via a portion of the first thermally conductive material extending through the second thermally conductive material; and
   a support structure joined to at least one surface of the thermal conduction layer;
   a ratio of a thickness of the thermal conduction layer to a thickness of the support structure being at least 1.5.

2. The electronic device of claim 1, wherein:
   the thermal conduction layer defines a first surface and a second surface opposite the first surface; and
   the support structure comprises a first support layer overlying the first surface and a second support layer overlying the second surface.

3. The electronic device of claim 2, wherein the first support layer and the second support layer have a same thickness.

4. The electronic device of claim 1, wherein a thickness of the support component is between 150 microns and 250 microns.

5. The electronic device of claim 1, wherein:
   the thermal conduction layer comprises copper; and
   the support structure comprises steel.

6. The electronic device of claim 1, wherein the support component has a Young's modulus greater than 100 Gigapascals (GPa).

7. The electronic device of claim 1, wherein the support component is planar.

8. The electronic device of claim 7, wherein the support component has an in-plane thermal conductivity of greater than 250 watts per meter-kelvin (W/(m·K)).

9. The electronic device of claim 1, further comprising a fastener welded to the support component with a weld strength of greater than 10 kilogram-force (kgf) in tension.

10. The electronic device of claim 1, further comprising a fastener welded to the support component with a weld strength of greater than 20 kgf in shear.

* * * * *